United States Patent
Tseng et al.

(10) Patent No.: US 11,949,043 B2
(45) Date of Patent: Apr. 2, 2024

(54) MICRO LIGHT-EMITTING DIODE

(71) Applicant: PlayNitride Display Co., Ltd., Zhunan Township, Miaoli County (TW)

(72) Inventors: Yen-Chun Tseng, Zhunan Township (TW); Tzu-Yang Lin, Zhunan Township (TW); Jyun-De Wu, Zhunan Township (TW); Fei-Hong Chen, Zhunan Township (TW); Yi-Chun Shih, Zhunan Township (TW)

(73) Assignee: PLAYNITRIDE DISPLAY CO., LTD., Zhunan Township, Miaoli County (TW)

(*) Notice: Subject to any disclaimer, the term of this patent is extended or adjusted under 35 U.S.C. 154(b) by 0 days.

(21) Appl. No.: 17/084,018

(22) Filed: Oct. 29, 2020

(65) Prior Publication Data

US 2022/0140188 A1 May 5, 2022

(51) Int. Cl.
*H01L 33/30* (2010.01)
*H01L 33/22* (2010.01)
(Continued)

(52) U.S. Cl.
CPC ........ *H01L 33/305* (2013.01); *H01L 33/0008* (2013.01); *H01L 33/22* (2013.01); *H01L 33/325* (2013.01)

(58) Field of Classification Search
CPC ......... H01L 51/5262; H01L 33/00–648; H01L 27/15–156; H01L 2933/00–0091
See application file for complete search history.

(56) References Cited

U.S. PATENT DOCUMENTS

| | | | |
|---|---|---|---|
| 2003/0080331 A1 | 5/2003 | Ono et al. | |
| 2006/0166386 A1* | 7/2006 | Yamada ................. | H01S 5/141 257/88 |

(Continued)

FOREIGN PATENT DOCUMENTS

| | | |
|---|---|---|
| CN | 102201514 A | 9/2011 |
| CN | 103748697 A | 4/2014 |

(Continued)

OTHER PUBLICATIONS

Taiwanese Office Action and Search Report dated Sep. 15, 2021 for Application No. 109137621.
(Continued)

*Primary Examiner* — Mohammad A Rahman
(74) *Attorney, Agent, or Firm* — Birch, Stewart, Kolasch & Birch, LLP

(57) ABSTRACT

A micro light-emitting diode is provided. The micro light-emitting diode includes a first-type semiconductor layer having a first doping type; a light-emitting layer over the first-type semiconductor layer; a first-type electrode over the first-type semiconductor layer; a second-type semiconductor layer having a second doping type over the light-emitting layer, wherein the second doping type is different from the first doping type; a second-type electrode over the second-type semiconductor layer; and a barrier layer under the first-type semiconductor layer and away from the first-type electrode and the second-type electrode, wherein the barrier layer includes a doped region having the second doping type.

13 Claims, 5 Drawing Sheets

(51) Int. Cl.
*H01L 33/32* (2010.01)
*H01L 33/00* (2010.01)

(56) References Cited

U.S. PATENT DOCUMENTS

| | | |
|---|---|---|
| 2007/0029541 A1 | 2/2007 | Xin et al. |
| 2007/0075328 A1* | 4/2007 | Iizuka ................... H01L 33/14 257/103 |
| 2008/0227248 A1 | 9/2008 | Han |
| 2009/0267063 A1* | 10/2009 | Nakagawa ............. C30B 29/16 257/E33.013 |
| 2011/0233558 A1* | 9/2011 | Lee ......................... H01L 33/04 257/E33.056 |
| 2012/0280258 A1 | 11/2012 | Yeh et al. |
| 2016/0104815 A1 | 4/2016 | Li et al. |
| 2017/0279005 A1* | 9/2017 | Chen ................... H01L 33/0062 |
| 2017/0317237 A1 | 11/2017 | Gardner et al. |
| 2019/0157511 A1* | 5/2019 | Dai ....................... H01L 33/145 |
| 2019/0280155 A1* | 9/2019 | Lan ......................... H01L 33/02 |
| 2021/0111306 A1* | 4/2021 | Kim ...................... H01L 33/325 |
| 2021/0125825 A1* | 4/2021 | Cheng ................. H01L 29/2003 |
| 2021/0399167 A1* | 12/2021 | Baek ....................... H01L 33/32 |
| 2022/0085198 A1* | 3/2022 | Nishiguchi ....... H01L 29/66462 |

FOREIGN PATENT DOCUMENTS

| | | |
|---|---|---|
| CN | 104425660 A | 3/2015 |
| JP | 2003-46119 A | 2/2003 |
| JP | 2004-47760 A | 2/2004 |
| TW | 200822387 A | 5/2008 |
| TW | 201130159 A1 | 9/2011 |

OTHER PUBLICATIONS

Taiwanese Office Action dated Feb. 23, 2022 for Application No. 109137621.

Chinese Office Action and Search Report for Chinese Application No. 202011180312.7, dated Nov. 21, 2022.

* cited by examiner

MICRO LIGHT-EMITTING DIODE

BACKGROUND

Technical Field

The disclosure relates to a semiconductor device, and more particularly to a micro light-emitting diode.

Description of the Related Art

With the advancements being made in the field of optoelectronic technology, the size of optoelectronic components has gradually evolved toward miniaturization. In recent years, due to breakthroughs in the size of light-emitting diodes (LEDs), micro light-emitting diode (micro LED) displays in which arrays of light-emitting diodes are arranged in an array have increasingly interested people in the field. A micro LED display is an active micro semiconductor device display, and it is more energy efficient than organic light-emitting diode (OLED) displays. Furthermore, a micro LED display has better contrast performance than an OLED display, and it is visible under sunlight. In addition, since micro LED displays use inorganic material, they have better reliability and a longer lifetime than OLED displays.

The performance of the micro light-emitting diode display depends on the light extraction efficiency of the micro light-emitting diode used in the micro light-emitting diode display. In order to increase the light extraction efficiency, a roughening process is generally performed on the light-emitting surface. However, the size of the micro light-emitting diode is smaller than that of the conventional light-emitting diode. Therefore, during the roughening process, the defect density on the surface may also increase significantly, which adversely affects the yield of the micro light-emitting diode. Therefore, a novel micro light-emitting diode with improved light extraction efficiency is desired.

SUMMARY

Some embodiments of the present disclosure provide a micro light-emitting diode, including: a first-type semiconductor layer having a first doping type; a light-emitting layer over the first-type semiconductor layer; a first-type electrode over the first-type semiconductor layer; a second-type semiconductor layer having a second doping type over the light-emitting layer, wherein the second doping type is different from the first doping type; a second-type electrode over the second-type semiconductor layer; and a barrier layer under the first-type semiconductor layer and away from the first-type electrode and the second-type electrode, wherein the barrier layer includes a doped region having the second doping type.

Some embodiments of the present disclosure provide a micro light-emitting diode, including: a first-type semiconductor layer having a first doping type; a light-emitting layer over the first-type semiconductor layer; a first-type electrode over the first-type semiconductor layer; a second-type semiconductor layer having a second doping type over the light-emitting layer, wherein the second doping type is different from the first doping type; a second-type electrode over the second-type semiconductor layer; and a barrier layer under the first-type semiconductor layer and away from the first-type electrode and the second-type electrode, wherein the barrier layer includes a doped region having the first or second doping type, wherein a doping concentration of the doped region is less than $1\times10^{16}$ cm$^{-3}$.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
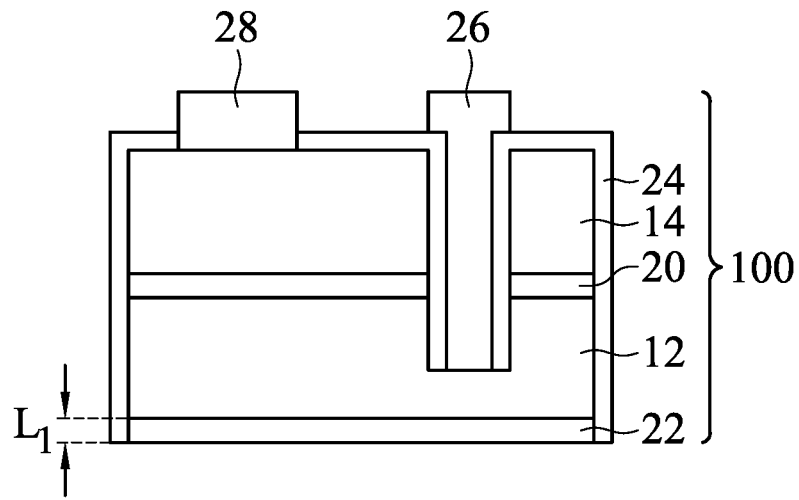
FIGS. 1A and 1B illustrate the cross-sectional view of the micro light-emitting diode according to some embodiments of the present disclosure.

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer hat does not directly contact the other layer, there being one or more intermediate layers disposed between the layer and the other layer.

In addition, the present disclosure may repeat reference numerals and/or letters in the various examples. This repetition is for the purpose of simplicity and clarity and does not in itself dictate a relationship between the various embodiments and/or configurations discussed. Some variations of embodiments are described below. In different figures and illustrated embodiments, similar element symbols are used to indicate similar elements.

The drawings provided are only schematic diagrams and are non-limiting. In the drawings, the size, shape, or thickness of some of the elements may be exaggerated and not drawn to scale, for illustrative purposes. The dimensions and the relative dimensions do not correspond to actual location in the practice of the disclosure. The disclosure will be described with respect to particular embodiments and with reference to certain drawings, but the disclosure is not limited thereto.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

Embodiments of the present disclosure provide a micro light-emitting diode. At least one current barrier layer having a different doping type from an epitaxial semiconductor layer is inserted between the light-emitting surface and the epitaxial semiconductor layer. Therefore, at least one PN junction is formed in the micro light-emitting diode. The built-in electric field formed by the PN junction prevents holes from diffusing downward. In addition, the doping concentration of the current bather layer can be adjusted to be much lower than that of the epitaxial semiconductor. Therefore, the current bather layer is a semiconductor layer approaching a high resistance value to prevent electrons from moving downward. In other words, the micro light-emitting diode of some embodiments of the present disclosure can reduce the current flowing through the surface, thereby improving the light extraction efficiency of the micro light-emitting diode.

In the present disclosure, the term "micro" means that the micro light-emitting diode may have a size of between 1 μm and 100 μm. For example, the micro light-emitting diode may have a maximum width of 20 μm, 10 μm or 5 μm, and the micro light-emitting diode may have a maximum height of less than 10 μm or 5 μm, but the present disclosure is not limited thereto. In other embodiments, the micro light-emitting diode may have a larger or smaller size.

Referring to FIG. 1A, in some embodiments, a micro light-emitting diode 100 includes a first-type semiconductor layer 12, second-type semiconductor layer 14, and a light-emitting layer 20 disposed between the first-type semiconductor layer 12 and the second-type semiconductor layer 14. The micro light-emitting diode 100 further includes a first-type electrode 26 disposed on the first-type semiconductor layer 12, and a second-type electrode 28 disposed on the second-type semiconductor layer 14.

In some embodiments, the micro light-emitting diode 100 may be a flip chip micro light-emitting diode having via holes. Therefore, the first-type electrode 26 penetrates the second-type semiconductor layer 14 and the light-emitting layer 20 to the first-type semiconductor layer 12 and is electrically connected to the first-type semiconductor layer 12. The second-type electrode 28 is disposed on the surface of the second-type semiconductor layer 14 and electrically connected to the second-type semiconductor layer 14 as shown in FIG. 1A. However, the present disclosure is not limited thereto. The micro light-emitting diode 100 may also be provided without via holes. The first-type electrode 26 and the second-type electrode 28 are directly disposed on the surfaces of the first-type semiconductor layer 12 and the second-type semiconductor layer 14, respectively.

Still referring to FIG. 1A, the micro light-emitting diode 100 of the present disclosure further includes a first barrier layer 22 disposed under the first-type semiconductor layer 12 and away from the first-type electrode 26 and second-type electrode 28. The first barrier layer 22 includes a doped region having a doping type different from that of the first-type semiconductor layer 12. Here, the first barrier layer 22 is doped in the entire layer, that is, the doped region is the first barrier layer 22 per se. Therefore, a PN junction can be formed in the micro light-emitting diode 100 to reduce the current flowing through the surface of the micro light-emitting diode 100.

In some embodiments, the first-type semiconductor layer 12 and the second-type semiconductor layer 14 may be formed of gallium nitride (GaN), aluminum nitride (AlN), aluminum gallium nitride (AlGaN), aluminum indium gallium nitride (InGaAlN), or a combination thereof. The first-type semiconductor layer 12 and the second-type semiconductor layer 14 may be formed by metal organic chemical vapor deposition (MOCVD), molecular beam epitaxy (MBE), or other suitable methods. In some embodiments, the first-type semiconductor layer 12 may be doped with P-type dopants, such as magnesium (Mg) or similar dopants. The second-type semiconductor layer 14 may be doped with N-type dopants, such as silicon (Si) or similar dopants.

As shown in FIG. 1A, the light-emitting layer 20 is disposed between the first-type semiconductor layer 12 and the second-type semiconductor layer 14. In some embodiments, the light-emitting layer 20 may be a single quantum well or multiple quantum wells (MQWs). The light-emitting layer 20 may be formed of InGaN/GaN and formed by metal organic chemical vapor deposition, molecular beam epitaxy, or other suitable methods. In some embodiments, multiple quantum wells can confine the movement of electrons and holes so that there is a higher probability of combining electrons and holes to improve light extraction efficiency.

In some embodiments, the first-type electrode 26 and the second-type electrode 28 may be formed of metals with good conductivity, such as gold (Au), silver (Ag), copper (Cu), platinum (Pt), aluminum (Al), nickel (Ni), Tin (Sn), magnesium (Mg), a combination thereof, or other conductive materials, such as indium tin oxide (ITO).

In some embodiments, the micro light-emitting diode 100 emits light downward. The first-type electrode 26, the second-type electrode 28, and the first barrier layer 22 are disposed on a side away from the light-emitting surface, so as to avoid blocking the light from the light-emitting diode 100.

In some embodiments, the first barrier layer 22 having a different doping type from the first-type semiconductor layer 12 is inserted between the light-emitting surface and the first-type semiconductor layer 12. Therefore, there is at least one PN junction in the micro light-emitting diode 100. The built-in electric field formed by the PN junction prevents holes from diffusing downward. Therefore, it can reduce the current flowing through the surface, thereby improving the light extraction efficiency of the micro light-emitting diode 100.

In some embodiments, the first-type semiconductor layer 12 may be a first doping type, such as P-type while the second-type semiconductor layer 14 and the doped region of the first barrier layer 22 may be a second doping type, such as N-type. In other embodiments, the doping type of the first-type semiconductor layer 12 may be N-type while the doping types of the second-type semiconductor layer 14 and the doped region of the first bather layer 22 may be P-type. If the doping concentration of the doped region of the first barrier layer 22 is too high, it will cause light absorption. In some embodiments, the doping concentration of the doped region of the first barrier layer 22 is between $10^{16}/cm^3$ and $10^{19}/cm^3$, such as between $10^{16}/cm^3$ and $10^{18}/cm^3$.

In some embodiments, the first barrier layer 22 may be formed of suitable material such as GaP or AlGaInP. In some embodiments, the first barrier layer 22 may be formed by metal organic chemical vapor deposition, molecular beam epitaxy, or other suitable methods.

As shown in FIG. 1A, in some embodiments, the thickness of the first-type semiconductor layer 12 is greater than 50 nm and less than or equal to 4 μm. The thickness $L_1$ of the first bather layer 22 is greater than 0 μm and less than 1 μm. If the thickness $L_1$ of the first barrier layer 22 is greater than or equal to 1 μm, it will cause light absorption.

As shown in FIG. 1A, in some embodiments, in order to prevent the first-type electrode 26 from electrically connecting with the second-type semiconductor layer 14, an insulating layer 24 may be formed. Specifically, the insulating layer 24 is disposed along the sidewall of the first-type electrode 26 in the via hole to electrically insulate the first-type electrode 26 from the second-type semiconductor layer 14 and the light-emitting layer 20, and expose the bottom surface of the first-type electrode 26. The first-type electrode 26 may be electrically connected to the first-type semiconductor layer 12 through the bottom surface. Furthermore, as shown in FIG. 1A, the insulating layer 24 may extend to cover the top surface and sidewall of the micro light-emitting diode 100, while exposing the first-type electrode 26 and the second-type electrode 28.

In some embodiments, the insulating layer 24 may be formed of silicon oxide, silicon nitride, silicon oxynitride, or other suitable transparent insulating materials.

Although a substrate is not illustrated in FIG. 1A, it should be understood that the micro light-emitting diode 100 may be formed on a substrate, such as a sapphire substrate or other epitaxial substrate. In some embodiments, the substrate may be removed, or the micro light-emitting diode 100 may be disposed on various carrier substrates or heat dissipation substrates, such as ceramic, glass, or metal substrates, etc. Subsequent transfer processes may be performed to transfer the micro light-emitting diode to a display substrate (not shown).

Figure 1B:
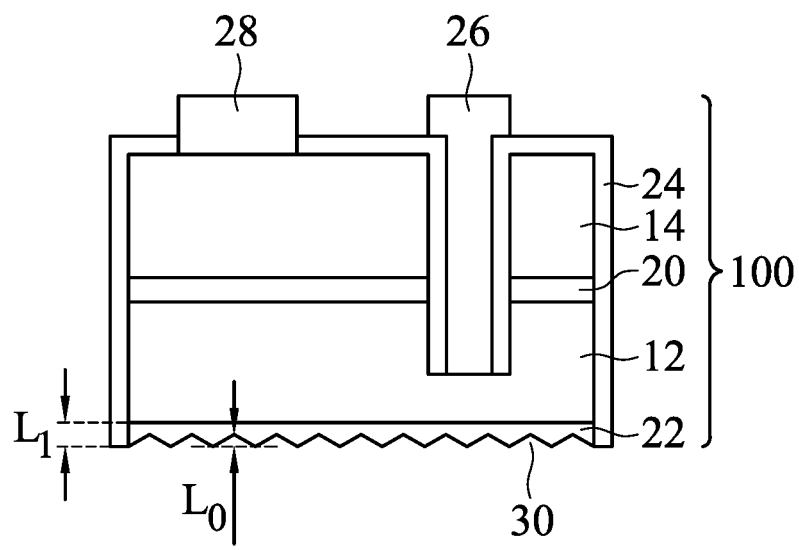

Referring to FIG. 1B, in some embodiments, the bottom surface of the first barrier layer 22 may be roughened so that the first barrier layer 22 includes at least one recessed structure 30. The recessed structure 30 is recessed upward from the bottom surface of the first barrier layer 22 to interior of the first barrier layer 22. Roughening the bottom surface of the first barrier layer 22 may increase the light extraction efficiency to improve the light extraction efficiency of the micro light-emitting diode 100.

In some embodiments, the depth $L_0$ of the recessed structure 30 is less than or equal to the thickness $L_1$. In some embodiments, the depth $L_0$ is between 1 nm and 3.5 nm. If the depth $L_0$ is too deep, the defect density will increase.

Figure 2A:
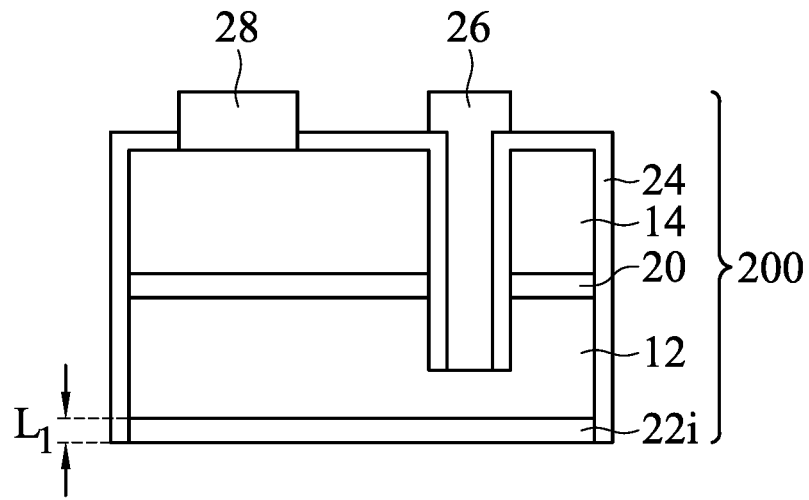
FIGS. 2A and 2B illustrate the cross-sectional view of the micro light-emitting diode according to some embodiments of the present disclosure.

FIG. 2A illustrates another embodiment of the present disclosure. Compared to the embodiments shown in FIGS. 1A and 1B in which the first barrier layer 22 has the opposite doping type to that of the first-type semiconductor layer 12 is used, in the embodiment shown in FIG. 2A, a first barrier layer 22i is used to replace the first barrier layer 22. The doping concentration of the first barrier layer 22i is much less than that of the first-type semiconductor layer 12 or the second-type semiconductor layer 14. The first barrier layer 22i is referred to as an "i-type layer", and is a semiconductor layer with a relatively high resistance value and approaching an undoped semiconductor layer. In some embodiments, the doping type of the first barrier layer 22i is opposite to that of the first-type semiconductor layer 12 and the doping concentration may be less than or equal to $10^{16}/cm^3$. In some embodiments, the first-type semiconductor layer 12 may be P-type doped, the second-type semiconductor layer 14 may be N-type doped, and the doping concentration of the doped region of the first barrier layer 22i may be less than or equal to one tenth of the doping concentration of the first-type semiconductor layer 12. The doping concentration of the doped region of the first barrier layer 22i is much less than that of the first-type semiconductor layer 12, so that the first barrier layer 22i approaches an undoped semiconductor layer with a higher resistance value. It can prevent electrons from moving downward to reduce the current flowing through the surface, thereby improving the light extraction efficiency of the micro light-emitting diode. In some embodiments, the first barrier layer 22i has the same doping type as the first-type semiconductor layer 12 and the doping concentration of the doped region may be less than or equal to $10^{16}/cm^3$. The doping concentration of the doped region of the first barrier layer 22i may be less than or equal to one tenth of the doping concentration of the first-type semiconductor layer 12. Since the doping concentration of the doped region of the first barrier layer 22i is much less than that of the first-type semiconductor layer 12, the first barrier layer 22i approaches an undoped semiconductor layer with a higher resistance value. It can prevent electrons from moving downward to reduce the current flowing through the surface.

Figure 2B:
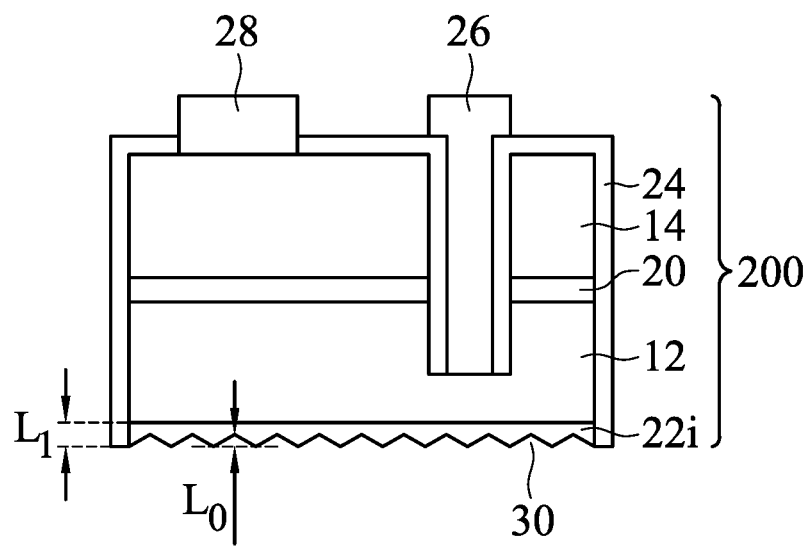

Referring to FIG. 2B, similarly, the bottom surface of the first barrier layer 22i may be roughened so that the first barrier layer 22i includes at least one recessed structure 30. The recessed structure 30 is recessed upward from the bottom surface of the first barrier layer 22i to interior of the first barrier layer 22i. Roughening the bottom surface of the first barrier layer 22i may increase the light extraction efficiency to improve the light extraction efficiency of the micro light-emitting diode 200.

In some embodiments, the depth $L_e$ of the recessed structure 30 is less than or equal to the thickness $L_1$. In some embodiments, the depth $L_0$ is between 1 nm and 3.5 nm. If the depth $L_0$ is too deep, the defect density will increase.

Figure 3A:
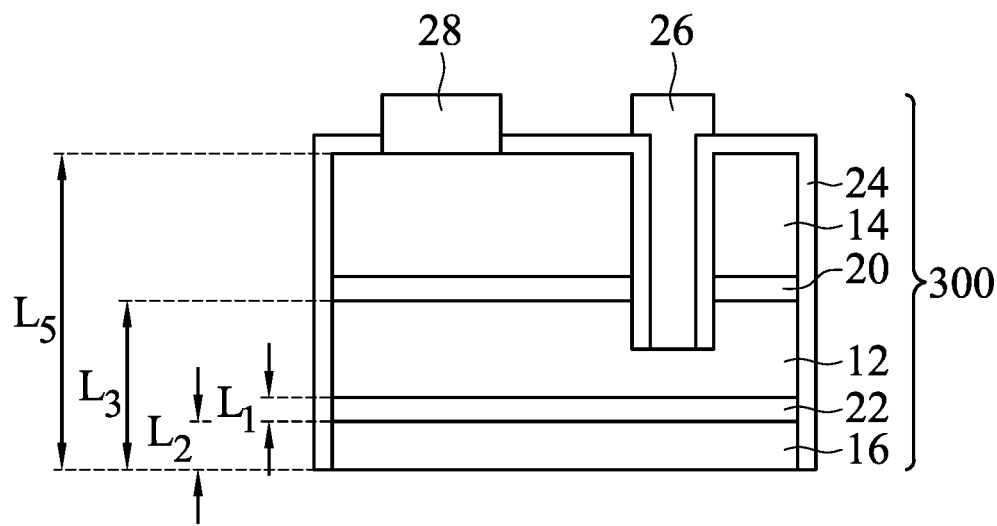
FIGS. 3A and 3B illustrate the cross-sectional view of the micro light-emitting diode according to some embodiments of the present disclosure.

Referring to FIG. 3A, in some embodiments, the micro light-emitting diode 300 may further include a third-type semiconductor layer 16. The third-type semiconductor layer 16 is disposed under the first barrier layer 22. In some embodiments, the first-type semiconductor layer 12 and the third-type semiconductor layer 16 have the same doping type, and the doping type is opposite to that of the first barrier layer 22. Therefore, an NPN or PNP junction may be formed in the micro light-emitting diode 300 to reduce the current flowing through the surface of the micro light-emitting diode 300, thereby improving the light extraction efficiency of the micro light-emitting diode 300.

In some embodiments, the materials and manufacturing methods of the third-type semiconductor layer 16 may refer to the materials and manufacturing methods of the first-type semiconductor layer 12 or the second-type conductor layer 14. It is not repeated again herein.

In some embodiments, the doping concentration of the third-type semiconductor layer 16 is greater than that of the first-type semiconductor layer 12, which may avoid light absorption and further improve the light extraction efficiency.

Still referring to FIG. 3A, in some embodiments, the thickness of the first-type semiconductor layer 12 is greater than 50 nm and less than or equal to 4 µm. The thickness $L_1$ of the first barrier layer 22 is greater than 0 µm and less than 1 µm. The thickness $L_2$ of the third-type semiconductor layer 16 is greater than or equal to 0 µm and less than 4 µm. The total thickness $L_3$ of the first-type semiconductor layer 12, the first barrier layer 22, and the third-type semiconductor layer 16 is less than or equal to 4 µm. A ratio of the thickness L2 to the thickness L3 is less than 0.99 and preferably greater than 0.90. If the ratio is too small, it will result in poor electrode contact efficiency. If the ratio is too large, it will cause light absorption. A ratio of the thickness L2 to the thickness L5 of the top surface of the second-type semiconductor layer 14 to the bottom surface of the third-type semiconductor layer 16 is less than or equal to 0.8.

Figure 3B:
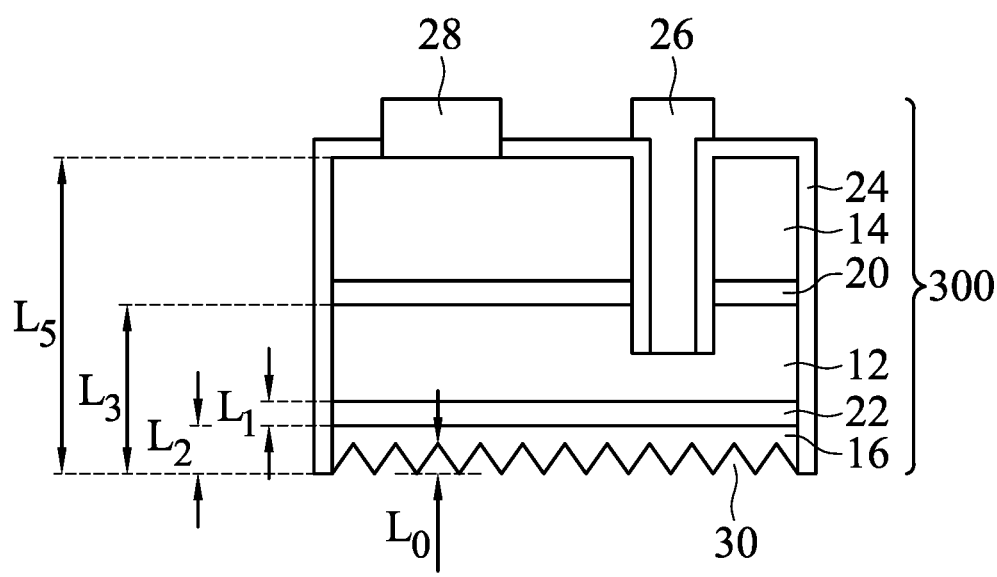

Referring to FIG. 3B, in some embodiments, the bottom surface of the third-type semiconductor layer 16 may be roughened so that the third-type semiconductor layer 16 includes at least one recess structure 30.

Figure 4:
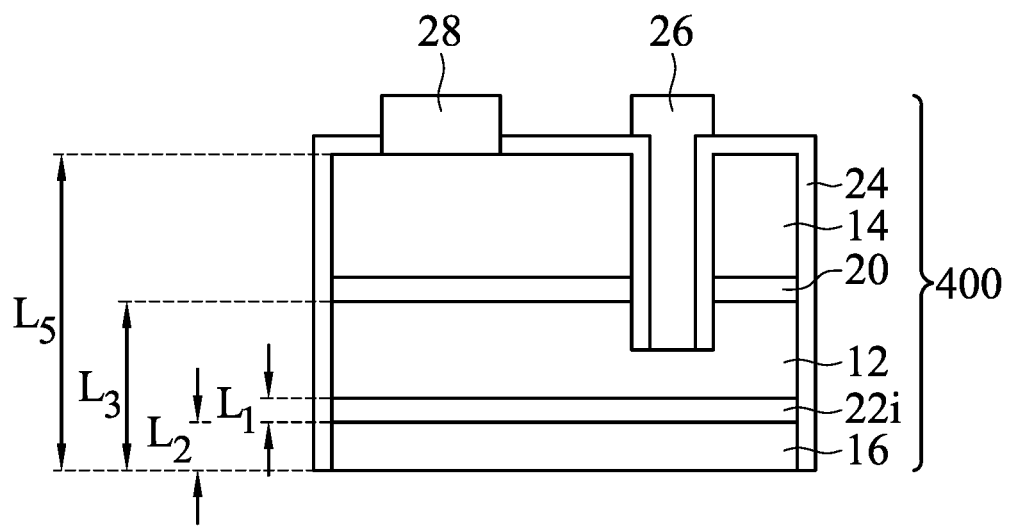
FIG. 4 illustrates the cross-sectional view of the micro light-emitting diode according to some embodiments of the present disclosure.

Referring to FIG. 4, the third-type semiconductor layer 16 may also be disposed under the first bather layer 22i as shown in the micro light-emitting diode 400. In some embodiments, the third-type semiconductor layer 16 has the same doping type as the first-type semiconductor layer 12. In other embodiments, the third-type semiconductor layer 16 has the opposite doping type to that of the first-type semiconductor layer 12. For example, the first-type semiconductor layer 12 may be P-type doped, and the third-type semiconductor layer 16 may be N-type doped. The first-type semiconductor layer 12, the first barrier layer 22i, and the third-type semiconductor layer 16 form a PiN interface. The third-type semiconductor layer 16 has the opposite doping type to that of the first-type semiconductor layer 12 to further prevent the current from flowing downward. Therefore, the third-type semiconductor layer 16 may be regarded as a second barrier layer.

Figure 5:
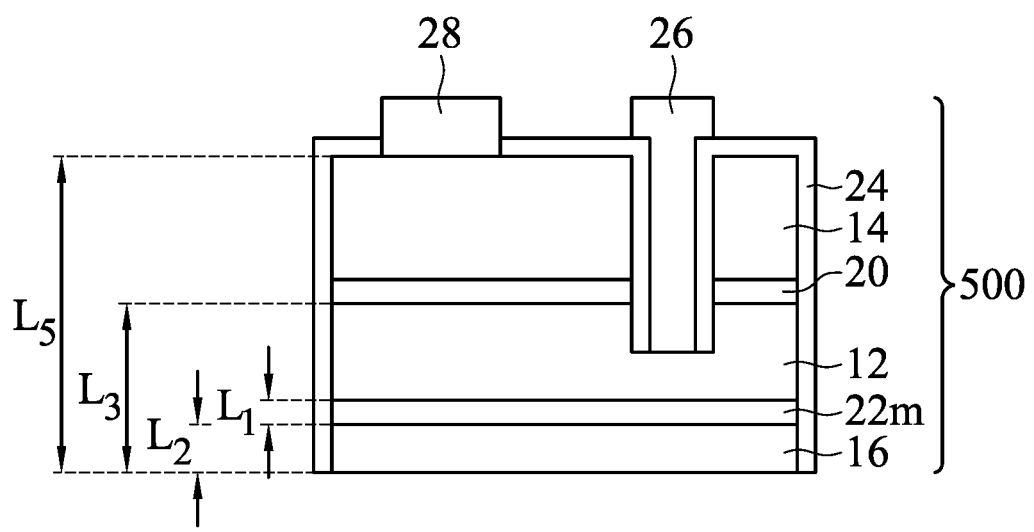
FIG. 5 illustrates the cross-sectional view of the micro light-emitting diode according to some embodiments of the present disclosure.

Referring to FIG. 5, in some embodiments, a first bather layer 22m may include one or more PN junction structures. In some embodiments, the PN junction structure is arranged periodically with a period of about 10 Å to about 1 nm. In other embodiments, the PN junction structure is arranged periodically but with a period outside the range described above. In yet other embodiments, the PN junction structure may be an aperiodic structure, and multiple PN junction structures may be formed with irregular thickness and doping concentration. In some embodiments, the P-type and N-type doping concentration of the P-type and N-type junctions in the multiple PN junction structures may be greater than or equal to $10^{16}/cm^3$ and less than or equal to $10^{19}/cm^3$. The P-type doping concentration of the P-type and i-type junctions in the multiple PN junction structures may be greater than or equal to $10^{16}/cm^3$ and less than or equal to $10^{19}/cm^3$. The N-type doping concentration of the N-type and i-type junctions in the multiple PN junction structures may be greater than or equal to $10^{16}/cm^3$ and less than or equal to $10^{19}/cm^3$.

Figure 6:
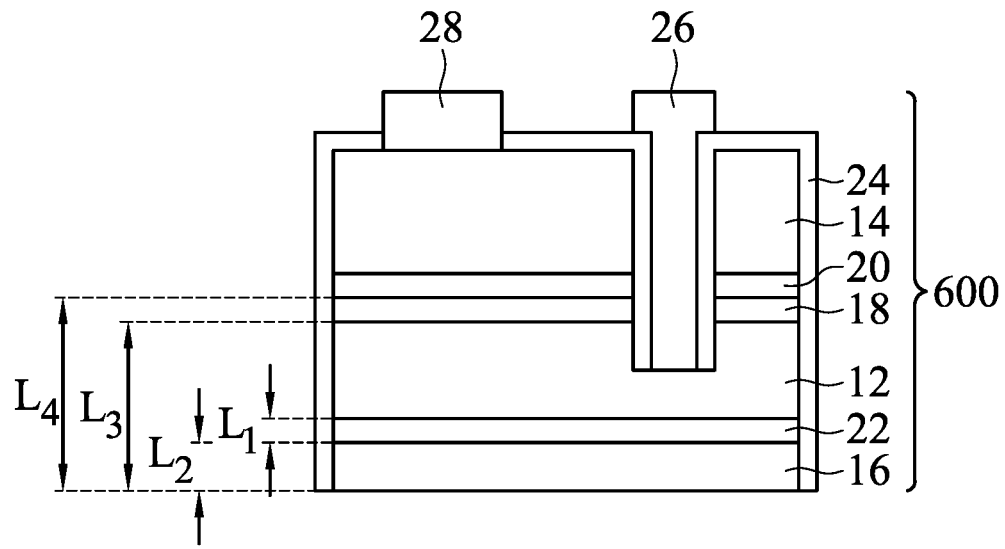
FIG. 6 illustrates the cross-sectional view of the micro light-emitting diode according to some embodiments of the present disclosure.

Referring to FIG. 6, in some embodiments, the micro light-emitting diode 600 may further include a fourth-type semiconductor layer 18. The fourth-type semiconductor layer 18 is disposed between the first-type semiconductor layer 12 and the light-emitting layer 20. In some embodiments, the doping types of the first-type semiconductor layer 12, the third-type semiconductor layer 16, and the fourth-type semiconductor layer 18 are different from those of the second-type semiconductor layer 14 and the first barrier layer 22. Therefore, PN junctions may be formed in the micro light-emitting diode 600 to reduce the current flowing through the surface of the micro light-emitting diode 600.

In some embodiments, the material of the fourth-type semiconductor layer 18 is different from that of the first-type semiconductor layer 12. The fourth-type semiconductor layer 18 may be formed of ALP, and may be a P-type doped ALP cladding layer. The fourth-type semiconductor layer 18 may limit the carriers in the MQWs, so that the carriers have a higher probability to combine with each other to improve the light extraction efficiency. In some embodiments, the manufacturing methods of the fourth-type semiconductor layer 18 may refer to the manufacturing methods of the first, second, and third-type semiconductor layers 12, 14, and 16. It is not repeated again herein.

In some embodiments, the first-type semiconductor layer 12, the third-type semiconductor layer 16, and the fourth-type semiconductor layer 18 may be P-type doped while the doped region of first barrier layer 22 and the second-type semiconductor layer 14 may be N-type doped. In other embodiments, the first-type semiconductor layer 12, the third-type semiconductor layer 16, and the fourth-type semiconductor layer 18 may be N-type doped while the doped region of first barrier layer 22 and the second-type semiconductor layer 14 may be P-type doped.

Still referring to FIG. 6, in some embodiments, the total thickness $L_3$ of the first-type semiconductor layer 12, the first barrier layer 22, and the third-type semiconductor layer 16 is greater than or equal to 50 nm and less than 4 µm. A ratio of the total thickness $L_3$ of the first type semiconductor layer 12, the first barrier layer 22, and the third-type semiconductor layer 16 to the total thickness $L_1$ of the fourth-type semiconductor layer 18, the first-type semiconductor layer 12, the first barrier layer 22, and the third-type semiconductor layer 16 is greater than 0.1.

Figure 7:
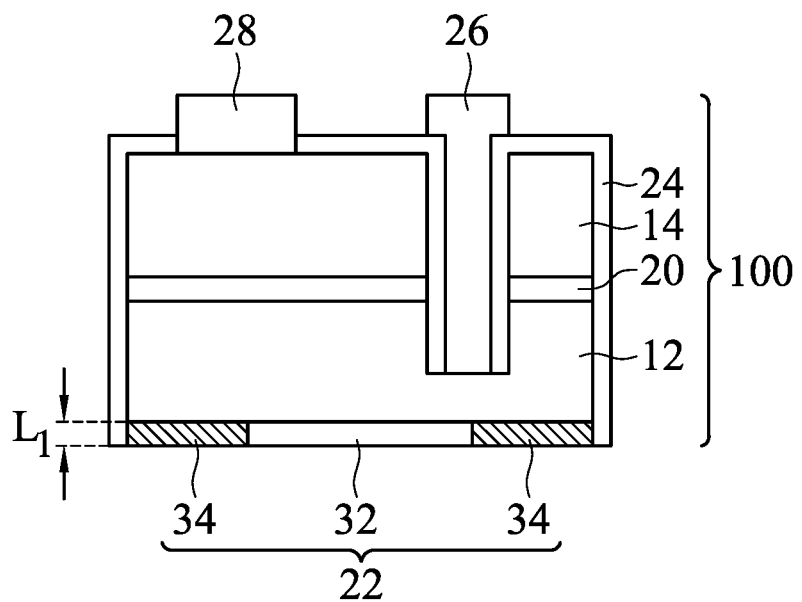
FIG. 7 illustrates the cross-sectional view of the micro light-emitting diode according to some embodiments of the present disclosure.

The doped region in the first barrier layer of the embodiments of present disclosure may also be formed of a plurality of regions having different doping types, as long as it includes at least one region having the opposite doping type to that of the first-type semiconductor layer 12. The following takes the first barrier layer 22 in FIG. 1A as an example for description. Referring to FIG. 7, in some embodiments, the first barrier layer 22 may include at least one insulating region 34 and at least one doped region 32. The insulating region 34 is disposed outside the doped region 32. In some embodiments, a distance from the right edge of the doped region 32 to the right edge of the micro light-emitting diode, or a distance from the left edge of the doped region 32 to the left edge of the micro light-emitting diode may be greater than or equal to 1 μm. It should be understood that the structure of the first barrier layer 22 of the embodiment shown in FIG. 7 may also be applied to the first barrier layers 22$i$ and 22$m$ shown in other embodiments.

In some embodiments, the first barrier layer may be formed of a suitable material, such as GaP or AlGaInP, and may be formed by metal organic chemical vapor deposition, molecular beam epitaxy, or other suitable methods. Subsequently, N-type or P-type dopants may be doped into the first barrier layer by ion implantation to form the doped region 32 so that the doped region 32 has a different doping type from the first-type semiconductor layer 12. In some embodiments, a suitable process such as a lithography process, and a suitable insulating material such as silicon dioxide ($SiO_2$) or the like may be used to form the insulating region 34.

A micro light-emitting diode is provided in the present disclosure. By inserting at least one current barrier layer with a different doping type from the epitaxial semiconductor layer between the light-emitting surface and the epitaxial semiconductor layer. The built-in electric field formed by the PN junction in the micro light-emitting diode prevents the holes from diffusing downward. Furthermore, the doping concentration of the barrier layer is much lower than that of the epitaxial semiconductor so that it can prevent electrons from moving downward. The micro light-emitting diode of the embodiments of the present disclosure can reduce the current flowing through the surface, thereby improving the light extraction efficiency of the micro light-emitting diode.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A micro light-emitting diode, comprising:
   a first-type semiconductor layer having a first doping type;
   a light-emitting layer over the first-type semiconductor layer;
   a first-type electrode over the first-type semiconductor layer;
   a second-type semiconductor layer having a second doping type over the light-emitting layer, wherein the second doping type is different from the first doping type;
   a second-type electrode over the second-type semiconductor layer;
   a barrier layer under the first-type semiconductor layer and away from the first-type electrode and the second-type electrode, wherein the barrier layer comprises a doped region having the second doping type; and
   a third-type semiconductor layer having the first doping type under the barrier layer, wherein the barrier layer and the third-type semiconductor layer are both non-ohmic contact layers, wherein the first-type electrode penetrates the second-type semiconductor layer, the light-emitting layer and extends into the first-type semiconductor layer and is electrically connected to the first-type semiconductor layer, and wherein a thickness of the third-type semiconductor layer is a first thickness, and a total thickness of the first-type semiconductor layer, barrier layer, and third-type semiconductor layer is a second thickness, wherein a ratio of the first thickness to the second thickness is greater than 0.9.

2. The micro light-emitting diode as claimed in claim 1, wherein a bottom surface of the barrier layer comprises a roughened structure.

3. The micro light-emitting diode as claimed in claim 2, wherein the roughened structure comprises at least a recessed structure recessing upward from the bottom surface to an interior of the barrier layer, wherein a thickness of the barrier layer is a third thickness, and a depth of the recessed structure is a first depth, wherein the first depth is less than or equal to the third thickness.

4. The micro light-emitting diode as claimed in claim 1, wherein a doping concentration of the third-type semiconductor layer is greater than a doping concentration of the first-type semiconductor layer.

5. The micro light-emitting diode as claimed in claim 1, wherein a bottom surface of the third-type semiconductor layer comprises a roughened structure.

6. The micro light-emitting diode as claimed in claim 1, wherein a thickness of the first-type semiconductor layer is greater than 50 nm and less than or equal to 4 μm, a thickness of the third-type semiconductor layer is less than 4 μm, a thickness of the barrier layer is less than 1 μm, and a doping concentration of the doped region is between $1 \times 10^{16}$ $cm^{-3}$ and $1 \times 10^{19}$ $cm^{-3}$.

7. The micro light-emitting diode as claimed in claim 1, further comprising a fourth-type semiconductor layer having the first doping type and disposed between the light-emitting layer and the first-type semiconductor layer, wherein a total thickness of the first-type semiconductor layer, barrier layer, and third-type semiconductor layer is a third thickness, and a total thickness of the fourth-type semiconductor layer, first-type semiconductor layer, barrier layer, and third-type semiconductor layer is a fourth thickness, wherein a ratio of the third thickness to the fourth thickness is greater than 0.1.

8. The micro light-emitting diode as claimed in claim 1, wherein the barrier layer comprises at least a PN junction structure.

9. The micro light-emitting diode as claimed in claim 1, wherein the barrier layer comprises a plurality of PN junction structures arranged periodically.

10. The micro light-emitting diode as claimed in claim 1, wherein the barrier layer further comprises at least one insulating region and at least one barrier region, wherein the at least one insulating region is disposed outside of the at least one barrier region.

11. The micro light-emitting diode as claimed in claim 10, wherein a distance between the at least one barrier region and an edge of the micro light-emitting diode is greater than or equal to 1 μm.

12. The micro light-emitting diode as claimed in claim 1, wherein a doping concentration of the doped region is less than $1 \times 10^{16}$ $cm^{-3}$.

13. The micro light-emitting diode as claimed in claim 1, wherein a doping concentration of the doped region is less than one tenth of a doping concentration of the first-type semiconductor layer.

\* \* \* \* \*